(12) United States Patent
Güyagüler et al.

(10) Patent No.: US 8,805,660 B2
(45) Date of Patent: Aug. 12, 2014

(54) METHOD AND SYSTEM FOR COUPLING RESERVOIR AND SURFACE FACILITY SIMULATIONS

(75) Inventors: Baris Güyagüler, Aberdeen (GB); Vito J. Zapata, Houston, TX (US); Hui Cao, Sugar Land, TX (US); Hernan F. Stamati, Bethesda, MD (US); Jonathan A. Holmes, Reading (GB)

(73) Assignees: Chevron U.S.A. Inc., San Ramon, CA (US); Schlumberger Technology Corporation, Houston, TX (US)

( * ) Notice: Subject to any disclaimer, the term of this patent is extended or adjusted under 35 U.S.C. 154(b) by 174 days.

(21) Appl. No.: 13/293,660

(22) Filed: Nov. 10, 2011

(65) Prior Publication Data

US 2012/0150518 A1 Jun. 14, 2012

Related U.S. Application Data

(60) Provisional application No. 61/422,354, filed on Dec. 13, 2010.

(51) Int. Cl.
*G06G 7/48* (2006.01)

(52) U.S. Cl.
USPC .......................................................... 703/10

(58) Field of Classification Search
USPC .......................................................... 703/10
See application file for complete search history.

(56) References Cited

U.S. PATENT DOCUMENTS

| | | | |
|---|---|---|---|
| 5,710,726 A | 1/1998 | Rowney et al. | 703/10 |
| 6,108,608 A | 8/2000 | Watts | 702/30 |
| 6,928,399 B1 | 8/2005 | Watts et al. | 703/2 |
| 7,379,853 B2 | 5/2008 | Middya | 703/10 |
| 7,434,619 B2 | 10/2008 | Rossi et al. | 166/250.15 |
| 7,752,023 B2 | 7/2010 | Middya | 703/10 |
| 8,401,832 B2 * | 3/2013 | Ghorayeb et al. | 703/9 |
| 2007/0112547 A1 | 5/2007 | Ghorayeb et al. | 703/10 |
| 2008/0133194 A1 | 6/2008 | Klumpen et al. | |
| 2009/0055141 A1 | 2/2009 | Moncorge et al. | |

OTHER PUBLICATIONS

Kosmala et al. SPE 84220; Coupling of a Surface Network with Reservoir Simulation; 2003; pp. 1-11.*
Hepguler et al.; Integration of a Field Surface and Production Network with a Reservoir Simulator; SPE Computer Applications; Jun. 1997; pp. 88-93.*
Barroux et al.; Linking reservoir and surface simulators: how to improve the coupled solutions; SPE 65159; 2000; pp. 1-14.*
Zapata et al.; Advances in Tightly Coupled Reservoir Wellbore Surface-Network simulation; SPE 71120; pp. 114-120.*

(Continued)

*Primary Examiner* — Hugh Jones
(74) *Attorney, Agent, or Firm* — Ana C. Jaquez

(57) ABSTRACT

A method, system and apparatus are disclosed for coupling independent reservoir and surface facility network simulators. A reservoir simulator is configured to simulate fluid flow in subterranean reservoirs and a surface facility network simulator is configured to simulate fluid flow in production equipment. Simulation of fluid flow in a subterranean reservoir is initiated using the reservoir simulator. Simulation of fluid flow in production equipment is initiated using the surface facility network simulator. The simulated fluid flow in the production equipment includes fluids produced from the subterranean reservoir. The simulation of fluid flow in the subterranean reservoir is coupled with the simulation of fluid flow in the production equipment using a sub-domain inflow performance relationship.

22 Claims, 11 Drawing Sheets

(56) References Cited

OTHER PUBLICATIONS

Emanuel et al.; Studies of Offshore Reservoir With an Interfaced Reservoir Piping Network Simulator; Journal of Petroleum Technology; 1981; pp. 399-406.*

Coats et al.; A Generalized Wellbore and Surface Facility Model Fully Coupled to a Reservoir Simulator; SPE Reservoir Evaluation & Engineering; 2004; pp. 132-142.*

Schiozer et al.; Use of Domain Decomposition for Simultaneous Simulation of Reservoir and Surface Facilities; SPE 27876; pp. 269-278.*

Ghorayeb et al.: A General Purpose Controller for Coupling Multiple Reservoir Simulations and Surface Facility Networks; 2004; pp. 1-15.*

Pettersen; Sandstone Compaction Modeling and Reservoir simulation; EAGE, Madrid, Jun. 2005; 50 pages.*

PCT Notification of Transmittal of the International Search Report and the Written Opinion of the International Searching Authority or the Declaration regarding PCT/US2011/060191 dated May 24, 2012 (9 pgs).

Barroux, C.C., et al.; "Linking Reservoir and Surface Simulators: How to Improve the Coupled Solutions"; SPE 65159, Oct. 2000, pp. 1-14.

Batycky, R.P., et al.; "A 3D Field-Scale Streamline-based Reservoir Simulator"; SPE Reservoir Engineering, Nov. 1997, pp. 246-254.

Coats, B.K., et al.; "A Generalized Wellbore and Surface Facility Model, Fully Coupled to a Reservoir Simulator"; SPE Reservoir Evaluation & Engineering, Apr. 2004, pp. 132-142.

DeBaun, D., et al.; "An Extensible Architecture for Next Generation Scalable Parallel Reservoir Simulation"; SPE 93274, 2005, pp. 1-13.

Dempsey, J.R., et al.; "An Efficient Model for Evaluating Gas Field Gathering System Design"; SPE 3161, Sep. 1971, pp. 1067-1073.

Emanuel, Alan S., et al.; "Studies of Offshore Reservoir With an Interfaced Reservoir/Piping"; Mar. 1981, pp. 399-406.

Ghorayeb, Kassem, et al.; "A General Purpose Controller for Coupling Multiple Reservoir Simulations and Surface Facility Networks"; SPE 79702, Feb. 2003, pp. 1-15.

Ghorayeb, Kassem, et al.; "Black Oil Delumping"; SPE 96571, Oct. 2005, pp. 1-13.

Güyagüler, B., et al.; "Integrated Optimization of Field Development, Planning, and Operation"; SPE 102557, Sep. 2007, pp. 1-13.

Haugen, E.D., et al.; "Simulation of Independent Reservoirs Coupled by Global Production and Injection Constraints"; SPE 29106, 1995, pp. 111-123.

Hepguler, Gokhan, et al.; "Integration of a Field Surface and Production Network With a Reservoir Simulator"; SPE Computer Applications, Jun. 1997, pp. 88-93.

Litvak, M.L., et al.; "Integration of Prudhoe Bay Surface Pipeline Network and Full Field Reservoir Models"; SPE 38885, Oct. 1997, pp. 435-443.

Litvak, M.L., et al.; "Prudhoe Bay E-Field Production Optimization System Based on Integrated Reservoir and Facility Simulation"; SPE 77643, 2002, pp. 1-11.

Litvak, M.L., et al.; "Surface Network and Well Tubinghead Pressure Constraints in Compositional Simulation"; SPE 29125, Feb. 1995, pp. 235-336.

Litvak, M.L., et al.; "Validation and Automatic Tuning of Integrated Reservoir and Surface Pipeline Network Models"; SPE 56621, Oct. 1999, pp. 1-8.

Schiozer, D.J., et al.; "Use of Domain Decomposition for Simultaneous Simulation of Reservoir and Surface Facilities"; SPE 27876, Mar. 1994, pp. 269-278.

Shiralkar, G.S., et al.; "An Efficient Formulation for Simultaneous Solution of the Surface Network Equations"; SPE 93073, 2005, pp. 1-6.

Startzman, R.A., et al.; "Computer Combines Offshore Facilities and Reservoir Forecasts"; Petroleum Engineer, May 1977, pp. 65, 68, 70, and 74.

Tingas, John, et al.; "Integrated Reservoir and Surface Network Simulation in Reservoir Management of Southern North Sea Gas Reservoirs"; SPE 50635, Oct. 1998, pp. 51-62.

Trick, M.D., et al.; "A Different Approach to Coupling a Reservoir Simulator with a Surface Facilities Model"; SPE 40001, Mar. 1998, pp. 285-290.

Wang, Pengju, et al.; "Optimization of Production Operations in Petroleum Fields"; SPE 77658, 2002, pp. 1-12.

Watts, J.W., et al.; "Determination of Active Constraints in a Network"; SPE 118877, Feb. 2009, pp. 1-12.

Weisenborn, A.J. (Toon), et al.; "Compositional Integrated Subsurface-Surface Modeling"; SPE 65158, Oct. 2000, pp. 1-12.

Zapata, V.J., et al.; Advances in Tightly Coupled Reservoir/Wellbore/Surface-Network Simulation; SPE Reservoir Evaluation & Engineering, Apr. 2001, pp. 114-120.

* cited by examiner

METHOD AND SYSTEM FOR COUPLING RESERVOIR AND SURFACE FACILITY SIMULATIONS

CROSS-REFERENCE TO A RELATED APPLICATION

The present application for patent claims the benefit of U.S. Provisional Application bearing Ser. No. 61/422,354, filed on Dec. 13, 2010, which is incorporated by reference in its entirety.

TECHNICAL FIELD

This invention relates to a method, system and apparatus for coupling independent reservoir and surface facility network simulators, and more particularly, to using sub-domain Inflow Performance Relationships (IPRs) for coupling reservoir and surface facility network simulations.

BACKGROUND

Reservoir simulations can be interfaced with surface facility network simulations to more accurately predict the interactions between wells and external surface facilities. In general, "reservoir simulations" refer to mathematical representations of fluid flow (e.g., oil, gas, water) in a physical subterranean reservoir and "surface facility network simulations" refer to mathematical representations of fluid flow through production equipment. For example, in deepwater oil and gas field development, wells from different reservoirs often flow through pipelines to a shared surface facility platform before being transported by a pipeline to the sale point. These facilities may consist of a network of flowlines from the wellheads joining at manifolds to form a gathering system and, for offshore fields, the risers that take the fluids up to the facilities on the platforms. Pressure losses in the surface production system can have a critical impact on well productivity. Therefore, it is highly advantageous for the simulation model to encompass both the reservoir and the surface facilities while performing simulations for field development planning and optimization.

Many software tools have been developed to integrate the modeling of reservoirs and surface facilities. For example, the concept of a simulation model combining both reservoir and surface facility calculations, applied to a gas-water system, is known in the art. A combined reservoir and surface facility simulator applicable to large offshore oil reservoirs producing through a gathering system network has also been published. This simulation method balances the facility network and reservoir models once per timestep using an estimated mid-timestep average of the reservoir conditions. The resulting well rates are then used as control targets for the wells over the timestep. A combined system in which the network is coupled explicitly to the well-reservoir system at the wellheads was also implemented in a commercial black oil reservoir simulator.

The concept of coupled reservoir and network models has also been extended to compositional simulation. For example, an implicit procedure has been published in which the conditions in the nodes of the network are solved simultaneously with the reservoir grid. Numerical derivatives of the pipeline pressure drops are used because multiphase flow correlations are hot always amenable to analytic differentiation. This approach was applied to build an integrated compositional model of the reservoir, well tubing strings, and surface pipeline network. This approach has further been refined for history matching the network model and optimization.

An alternative approach of coupling a separate, stand-alone network model to a reservoir simulator has also been pursued. The term "coupling," as used herein, is defined as being operatively linked or interconnected, such that the information from the separate, stand-alone surface facilities network model is utilized by the reservoir simulator during operation, and/or vice versa. Accordingly, "coupling" allows for communication between the separate simulators by sharing of data, such as through exchange of boundary conditions. Several fully featured stand-alone software products have been developed for modeling surface facilities and pipeline networks. These software products offer a choice of engineering correlations to compute pressure and temperature losses along the pipes and through the equipment components. They also include a graphical user interface for constructing the model. Further developments to reservoir simulators that provide greater flexibility in the data exchange with these network simulators and improve the performance of the coupling methods have also been made. Accordingly, direct use of these products is available instead of reproducing their features within the reservoir simulator, which would require substantial coding effort.

More recent advances have focused on the following diverse strategies:

A unified formulation in which the surface facility network is represented by an extension of the reservoir simulator's implicit well model.

Coupling separate reservoir and surface facility models by exchanging boundary conditions. Reservoir and surface facility network simulations are modeled separately using different applications, but integrated using externally coupled workflows that rely on exchanging Inflow Performance Relationships (IPRs) at the coupling points.

A unified model has been developed in which the simulator's discretized well model is extended to include the surface facility network. The network is thus solved simultaneously with the wells, and the equations modeling the well-network system are implicitly coupled to the reservoir model as a single system. An alternative formulation for the network equations has also been proposed such that they are placed in a similar form to the reservoir equations, thereby facilitating their solution by efficient linear solvers already developed for reservoir simulation. An approach using slack variables to the problem of determining which flow rate or pressure constraints are active at any time in a unified model where constraints can be applied at any location has also been developed.

With regards to the strategy of coupling separate reservoir and surface facility models, each of the examples referenced above have coupled a particular facility simulator to a particular reservoir simulator, without offering a choice of software products. To allow a selection of facility simulators to be coupled to a selection of reservoir simulators, a third software product called a "controller" has been developed. The controller is responsible for overseeing the coupled solution of the various domain models (reservoir and surface facilities), managing the exchange of boundary conditions between them, and advancing the global system through time. The individual domain models may have different fluid representations, such as black oil or compositional. The production streams from the models with the less detailed fluid representations are converted into the more detailed representation by a delumping process. This strategy of coupling separate surface and reservoir domain models by a field management controller has been implemented into a commercial simulator.

These two strategies have their own distinct advantages and disadvantages. The principal advantage of the unified strategy is that the complete network-well-reservoir system can be solved simultaneously in a fully-implicit numerical scheme, thereby retaining stability over the long timesteps desired in reservoir simulation. However, the features required for modeling surface facility networks have to be implemented in the reservoir simulator. The strategy of coupling separate software models offers the advantage of software choice. In principle, any third-party surface facilities simulator can be coupled to the system provided that a communications interface has been implemented to enable the exchange of boundary conditions and instructions. Thus, all of the tools and options available in the fully-featured surface facilities simulator are available for use without having to duplicate their implementation in the reservoir simulator.

The principal disadvantage of the coupled software strategy typically lies in the numerical stability of the coupling scheme. The separate surface facilities model is not solved simultaneously with the reservoir model as a single fully-implicit system. Instead, a timestep lagged or an iteratively lagged coupling scheme is used. A timestep lagged coupling scheme balances the system at the beginning of each timestep. The resulting conditions at the wells (the flow rate, bottomhole pressure, or tubing head pressure) are applied as well constraints while the reservoir simulation is advanced through time. Alternatively, the coupling may be carried out periodically with a predefined period length, which does not necessarily correspond to the timestep length used in the reservoir simulation. In either case, since the reservoir conditions evolve over the timestep, the applied well constraints might not accurately represent the balanced solution at the end of the timestep. For example, if the timestep between balancing calculations is too long, numerical instability may result and the well rates will likely oscillate from one timestep to the next.

An iteratively lagged coupling scheme rebalances the system at each iteration of the reservoir solution. However, the absence in the reservoir simulator's Jacobian matrix of derivatives representing the influence of the network will, in general, impede the convergence of the reservoir solution. Accordingly, the balancing process is typically performed only in the first few iterations of the reservoir solution, leaving the well constraints constant for the remaining iterations to assist convergence. Shortening the timestep will increase the accuracy of these coupling schemes and reduce the likelihood of instability, but at the expense of increasing the overall CPU time.

Therefore, previous coupled systems have exhibited instabilities due to the coupling calculated at the beginning of a timestep not being representative of the coupling at the end of the timestep. A method is needed that has all the advantages of external coupling, but eliminates some of its disadvantages, namely large balancing errors and possible oscillations resulting from the explicit approach.

SUMMARY

A method is disclosed for coupling independent reservoir and surface facility network simulators. The method comprises providing a reservoir simulator configured to simulate fluid flow in subterranean reservoirs and a surface facility network simulator configured to simulate fluid flow in production equipment. Simulation of fluid flow in a subterranean reservoir is initiated using the reservoir simulator. Simulation of fluid flow in production equipment is initiated using the surface facility network simulator. The simulated fluid flow in the production equipment includes fluids produced from the subterranean reservoir. The simulation of fluid flow in the subterranean reservoir is coupled with the simulation of fluid flow in the production equipment using a sub-domain inflow performance relationship.

A system for coupling independent reservoir and surface facility network simulators is also disclosed. The system includes a reservoir simulator, a surface facility network simulator, and a controller. The reservoir simulator is configured to simulate fluid flow in a subterranean reservoir. The surface facility network simulator is configured to simulate fluid flow, including fluids produced from the subterranean reservoir, in production equipment. The controller is configured to couple the simulation of fluid flow in the subterranean reservoir with the simulation of fluid flow in the production equipment using a sub-domain inflow performance relationship.

A controller for coupling independent reservoir and surface facility network simulators is also disclosed. The controller comprises a computer program product, which comprises a non-transitory computer usable medium having a computer readable program code embodied therein. The controller is configured to initiate simulation of fluid flow in a subterranean reservoir using a reservoir simulator. The controller is also configured to initiate simulation of fluid flow, including fluids produced from the subterranean reservoir, in production equipment using a surface facility network simulator. The controller is also configured to couple the simulation of fluid flow in the subterranean reservoir with the simulation of fluid flow in the production equipment using a sub-domain inflow performance relationship.

In one or more embodiments of the present invention, the reservoir simulator is a full-field commercial finite-difference reservoir simulator. In one or more embodiments of the present invention, the surface facility network simulator is a commercial non-transient surface facility network simulator.

In one or more embodiments of the present invention, the sub-domain inflow performance relationship allows for changes in reservoir grid cell conditions over timesteps.

In one or more embodiments of the present invention, the sub-domain inflow performance relationship defines a plurality of sub-domains each comprising a region around a well and fluxes from the global solution are used as boundary conditions for the plurality of sub-domains.

In one or more embodiments of the present invention, coupling the reservoir and surface facility network simulations comprises selecting a plurality of reservoir grid cells associated with one or more wells to create reservoir sub-domains, simulating the reservoir sub-domains to create the sub-domain inflow performance relationship, and utilizing the sub-domain inflow performance relationship as a boundary condition for simulating fluid flow in the production equipment using the surface facility network simulator.

The sub-domain inflow performance relationship defines reservoir sub-domains for the reservoir simulator by selecting reservoir grid cells for one or more wells. In one or more embodiments of the present invention, the grid cells are simulated within each sub-domain region from a $t_{i-1}$ to $t_i$ reservoir state. In one or more embodiments of the present invention, the reservoir sub-domains are defined once per simulation run. In one or more embodiments of the present invention, the reservoir grid cells are updated in the reservoir sub-domains for the one or more wells at each balancing period in a simulation run.

In one or more embodiments of the present invention, the sub-domain inflow performance relationship defines cell neighborhood regions. For example, the cell neighborhood regions can be constructed to include grid cells within a given distance-measure from a well. In one or more embodiments of the present invention, the sub-domain inflow performance relationship defines flow-based regions. In one or more embodiments of the present invention, the sub-domain inflow performance relationship defines distance-based regions.

In one or more embodiments of the present invention, the sub-domain inflow performance relationship defines reservoir sub-domains for the reservoir simulator, defines nodes and connecting edges for the reservoir sub-domains, and creates a property map including static and dynamic reservoir properties.

In one or more embodiments of the present invention, an open interface is provided. The open interface is configured to construct message packets and pass them to a parallel virtual machine systems annex to sequentially advance simulation through time between the reservoir simulator and the surface facility network simulator.

In one or more embodiments of the present invention, the controller is configured to initiate, in the reservoir simulator, selection of a plurality of reservoir grid cells associated with one or more wells to create reservoir sub-domains; initiate, in the reservoir simulator, simulation of the reservoir sub-domains; construct the sub-domain inflow performance relationship responsive to the simulation of the reservoir sub-domains; and initiate, in the surface facility network simulator, simulation of fluid flow in the production equipment using the sub-domain inflow performance relationship as a boundary condition.

DETAILED DESCRIPTION

Figure 1:
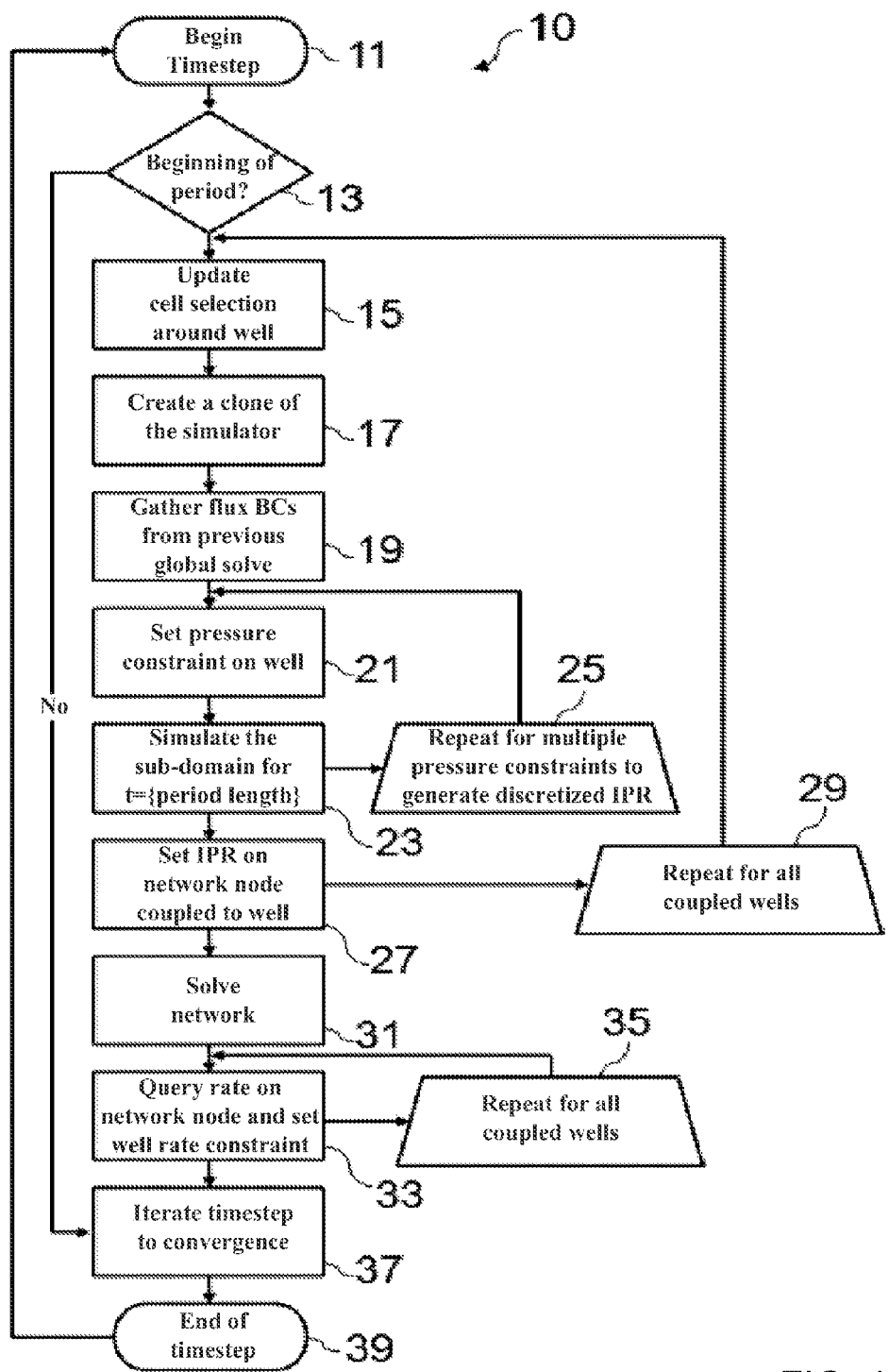
FIG. 1 is a flow diagram illustrating a method for coupling reservoir and surface facility network simulations.

A method, system and apparatus are disclosed for coupling independent reservoir and surface facility network, simulators, and more particularly, to using sub-domain Inflow Performance Relationships (IPRs) for coupling reservoir and surface facility network simulations. As used herein, a sub-domain IPR is a nonlinear IPR in which each pressure or rate point is evaluated by solving the well together with a surrounding sub-domain of the reservoir over the current timestep. An iterated solution of the reservoir sub-domain is utilized over the timestep, analogous to the iterated solution of the whole reservoir over the timestep. The nonlinear IPR is a set of rate versus pressure points obtained by solving the well at each point in turn. For example, the pressure points can be for bottomhole pressure (BHP) or tubing head pressure (THP). Conventional IPRs solved a well using the same grid cell boundary conditions at each point. This implied that the grid cell conditions such as pressure, and saturations did not vary appreciably with the well rate over the duration of the current timestep. One skilled in the art will recognize that this assumption is not correct, especially when the timestep is large or the grid cells connecting with the well are small.

As will be described herein, embodiments of the present invention utilize sub-domain IPRs that allow for changes in grid cell conditions over the timestep, which only assumes that the conditions on the boundary of the sub-domain do not change appreciably with the well rate over the timestep. In particular, the system and method calculate multi-point, nonlinear Inflow Performance Relationships by solving near-well sub-domains for the subsequent timestep. Flexible reservoir simulation architectures enable the dynamic creation and simulation of near-well sub-domains at run time. Sub-domains are automatically created within the vicinity of the well, or defined dynamically from the pressure gradient. These near-well sub-domain simulations are embedded within the full-field simulation, and extract all the required model properties from the full-field model. Fluxes from the latest global solution are used as boundary conditions for the near-well sub-domains.

The disclosed approach reduces the balancing errors and eliminates oscillations resulting from high errors by addressing the explicitness of the IPR exchanged at the boundary for externally coupled reservoir-surface workflows. The explicitness is addressed by carrying out mini-simulations to advance a sub-domain around each well to the next coupling time. In particular, before a balancing process begins, each sub-domain is solved repeatedly over the same timestep with different well constraints, thereby constructing an inflow performance relationship that reflects the near-well reservoir conditions at the end of the timestep. The resulting IPR is sent to the surface facilities model as the boundary condition for the well.

Therefore, the method, system and apparatus disclosed herein include defining regions around wells at run time, creating and simulating the sub-domains based on these regions, and using these sub-domain simulations to create IPRs representative of the end of the coupling period to reduce balancing errors and eliminate oscillations.

Creating Regions Around Wells

Reservoir simulators can be constructed with the capability to create regions around wells at run time. Aside from the convenience of not having to go back to the earth model, run-time processing also enables the regions to be based on dynamic properties, such as the flow patterns within the reservoir at the time when the surface facility network balancing takes place. Examples of types of regions include cell neighborhood regions, flow-based regions, and distance-based regions.

Cell neighborhood regions can be created around a specific set of starting cells, such as the cells containing the well completions. For example, a parameter n can be given that defines the number of "hops" away from the starting cells to include in the region. These "hops" are counted along the reservoir cell-to-cell connections. Therefore, if given two reservoir cells and n=4, a cell neighborhood region could be defined that includes the two starting cells plus every cell that can be reached from any starting cell with no more than 4 consecutive connections. If a well's neighborhood region contains cells in which other wells are completed, these cells can be excluded.

Flow-based regions are a grouping of the reservoir cells into fluid regions such as fluid regions that will likely flow towards a given a set of starting cells that contain well completions. Thus, these regions include all cells whose mobile fluids would eventually flow into the starting cells assuming the current potential gradient. For example, if the starting cells belong to a producing well, the fluids in the included cells would eventually be produced by the well. These regions can be populated beginning from the starting cells and expanding the set following the potential gradient upstream, adding to the region the reservoir cells encountered along the way. Under this scheme, a cell is added to the current set if its dominant reservoir flow direction is counter to the direction of the expansion. This process is repeated for all starting cells, which may end up belonging to different regions. The method can be reversed to define regions around injecting wells, for example, by following the potential gradient downstream. However, this approach is typically more likely to leave larger areas of the reservoir unassigned.

Distance-based regions can be defined based on a distance measure evaluated over reservoir connections. Starting from an initial set of cells, distance-based regions can form a partition where every cell is assigned to the region containing the closest starting cell. In this case, every cell in the reservoir is assigned one, and only one, region. Closeness can be evaluated using the reservoir connections that represent the cumulative distance over all possible paths that connect a cell to the set of starting cells. An example of a distance measure between two cells i and j is the sum of inverse transmissibility over a connection path. Mathematically, this can be written as $d_{ij}=\Sigma_c 1/T_c$, where c is a set of cell-to-cell connections connecting cells i and j. One skilled in the art will recognize that other distance measures are possible.

Defining and Simulating the Sub-Domains

A sub-domain, as used herein, refers to a collection of cells in pressure communication with a particular well of interest that is fully contained within the sub-domain. There may be more than one well within the domain, but the constraints of the other wells are kept fixed for the purposes of computing the IPR curve. Each sub-domain is therefore treated as an independent small reservoir with nonzero boundary conditions capturing the influence from the rest of the reservoir on it.

The size and shape of a sub-domain may or may not change throughout the simulation depending on the user's instructions. However, at the beginning of each timestep, cell selection is completed and the following two data objects are created and populated:

- The reservoir graph defining the nodes and connecting edges; and
- The property map that contains both static and dynamic properties such as transmissibility and pressure, respectively.

For a sub-domain spanning multiple processors, both data objects can be constructed locally from their reservoir counterparts. For the boundary fluxes, an additional graph can be created to relate edge information between the boundary cells of the sub-domain with the rest of the reservoir analogous to an inflow (outflow) graph between the reservoir and well. Likewise, the property map can be constructed locally. A clone of properties and dependency information from the reservoir property map can be created for the sub-domain. Data can be copied across the maps selectively to minimize this effort. For instance, arrays whose values are determined from property and linearization computes can be bypassed.

Since each sub-domain acts as an independent reservoir, it is natural for it to hold onto a clone of the reservoir model that provides all of the property and linearization computes. Boundary cell fluxes from the reservoir's most recent solve can be added to the sub-domain's linearization compute vector to handle the nonzero boundary condition. These fluxes remain constant while solving the sub-domain's equations.

Another object that typically consumes significant computational effort is the well model. This object, however, is shared between the reservoir and sub-domains. This is to avoid duplicating well and inflow graphs. These graphs describe the structure of the well and its connection to the reservoir, which do not change during the sub-domain solve. Only changes that do not alter the configuration of the well are allowed, such as changing the well constraint or closing a completion to stop cross-flow from occurring.

The sub-domain solver advances the sub-domain solution through a prescribed interval of time. This interval represents the period of time between network balancing steps. The timestep loop automatically determines a series of timestep sizes to reach the end of this interval. Since convergence is not guaranteed, the timestep loop is also able to repeat a timestep using smaller timestep sizes to achieve a convergent result. In one embodiment, the sub-domain solver contains all the key elements of the reservoir solver with two exceptions. It does not interact directly with the environment or with field management. Thus, within the timestep loop, there is no call back from any outside controller.

The nonlinear iteration loop in the sub-domain solver is similar to its reservoir counterpart. All major components comprising the bulk of the numerical work within this loop share the same code used by the reservoir nonlinear iteration loop to compute properties, construct the Jacobian and residual, and solve the linear system of equations. Thus, from a computational perspective, the sub-domain solver can solve the same complexity of problems in parallel as the reservoir solver. This is made possible by the object-oriented design of a reservoir simulator—providing a framework for reuse of basic components to develop advanced applications such as the sub-domain solver.

Surface Facility Network Coupling Algorithm

The reservoir and surface facility network are externally coupled by exchanging IPRs such as at the bottomhole or the wellhead. Depending on the case, some additional information such as temperature and densities may also be utilized. Typically no further information (e.g., gradients) is required, which enables the use of external commercial surface facility network simulators to take part without having to modify their internal code. Accordingly, the reservoir can be modeled with a full-field commercial finite-difference reservoir simulator and the surface facilities can be modeled with a commercial non-transient network simulator.

Several coupling schemes can be used such as timestep lagged, iteratively lagged, or periodic. In a timestep lagged scheme, balancing takes place at the beginning of the every timestep. In an iteratively lagged scheme, balancing takes place in the first few Newton iterations of every timestep. In a periodic scheme, balancing is carried out periodically with a predefined fixed period length, which does not necessarily correspond to the timestep length used by the reservoir simulation. Periodic schemes are generally the most appropriate scheme when coupling multiple reservoirs to one or multiple surface facility networks. Such schemes cannot be used with implicitly coupled reservoir-surface workflows.

In basic conventional approaches for externally coupled reservoir-surface models, the following steps are typically performed. For each well, the well IPR is created based on the current state of the reservoir. The IPR is then passed to the surface facility network and the surface facility network is solved. The network is then queried for the preferred property such as flow rate or pressure, which is set as the constraint on the reservoir well. Once all well constraints are set on the reservoir, simulation resumes timestepping and the process is repeated at the beginning of the next period.

This approach amounts to an explicit coupling of the reservoir and the surface facility network since the well IPRs used for $t_i$ are calculated with the reservoir state at $t_{i-1}$. The explicit nature of the process results in errors at the well boundary. The extent of this balancing error depends on the length of the period and the rate of change of pressures and saturations within the reservoir, especially within the grid cells in the wells vicinity. Higher balancing errors cause the results of the coupled system to diverge from the correct solution. As used herein, IPRs calculated with the reservoir state at $t_{i-1}$ are referred to as explicit IPRs.

To reduce the balancing errors associated with conventional approaches, a sub-domain is defined for a region around the wells and is used to calculate the IPR that is more representative of the reservoir state at $t_i$. This is achieved by simulating the sub-domain cells from their $t_{i-1}$ state to their $t_i$ state. Only the cells that are in the sub-domain are simulated, and there are typically a much smaller number of cells in the sub-domain than in the global domain or full-field model. The sub-domain simulation is a smaller-scale clone of the full global simulation, although uses the same fluid description, rock properties, and well-definitions. Fluxes from the last global solve are set as boundary conditions for the sub-domains. Therefore, the only partially explicit portion of this approach is the sub-domain boundary conditions. As used herein, IPRs obtained with this method are referred to as sub-domain IPRs.

The above described methods can be implemented in the general context of instructions executed by a computer. Such computer-executable instructions may include programs, routines, objects, components, data structures, and computer software technologies that can be used to perform particular tasks and process abstract data types. Software implementations of the above described methods may be coded in different languages for application in a variety of computing platforms and environments. It will be appreciated that the scope and underlying principles of the above described methods are not limited to any particular computer software technology.

Moreover, those skilled in the art will appreciate that the above described methods may be practiced using any one or a combination of computer processing system configurations, including, but not limited to, single and multi-processor systems, hand-held devices, programmable consumer electronics, mini-computers, or mainframe computers. The above described methods may also be practiced in distributed computing environments where tasks are performed by servers or other processing devices that are linked through one or more data communications networks. In a distributed computing environment, program modules may be located in both local and remote computer storage media including memory storage devices.

Also, an article of manufacture for use with a computer processor, such as a compact disc (CD), pre-recorded disk or other equivalent devices, could include a computer program storage medium and program means recorded thereon for directing the computer processor to facilitate the implementation and practice of the above described methods. Such devices and articles of manufacture also fall within the spirit and scope of the present invention.

As will be described, the invention can be implemented in numerous ways, including for example as a method (including a computer-implemented method), a system (including a computer processing system), an apparatus, a computer readable medium, a computer program product, a graphical user interface, a web portal, or a data structure tangibly fixed in a computer readable memory. Several embodiments of the present invention are discussed below. The appended drawings illustrate only typical embodiments of the present invention and therefore are not to be considered limiting of its scope and breadth.

FIG. 1 shows method 10, which utilizes sub-domain IPRs, according to an embodiment of the present invention. In step 11, method 10 starts by beginning the timestep. In step 13, it is determined whether it is the beginning of the period. As previously described, surface-reservoir coupling is often carried out periodically. For example, balancing can be carried out every 30 days. The simulator can take multiple timesteps within each period. If it is determined in step 13 that it is not the beginning of the period, the timestep is iterated to convergence and a new timestep is started in step 11. If the period is at the beginning in step 13, cell-selection around the well is updated in step 15. The cell-selection defines the well sub-domain and can either be static or dynamic. In static cell-selection, sub-domains are defined once per run. For example, the sub-domain can be defined as a predetermined number of cell "hops" away from the well-cells, such as 10 cell hops. In dynamic cell-selection, a sub-domain is updated at every balancing period. For example, the sub-domain can be based on the flow-gradient around the well.

In step 17, a clone of the simulator is created to simulate the sub-domain. The simulator clone uses the same model parameters as the global full-field model, such as PVT, rock properties, and linear solver settings. In step 19, the flux boundary conditions (BCs) are gathered from the previous global solve. This is the explicit part of this process as the fluxes from the previous timestep are used as the sub-domain boundary conditions. One skilled in the art will appreciate that special considerations are generally taken in the first timestep since there is no flux at the beginning of the simulation.

In step 21, a pressure constraint is placed on the well. For example, the constraint can be a bottomhole pressure (BHP) or tubing head pressure (THP) constraint. The sub-domain is simulated in step 23. A discretized IPR is generated for multiple pressure constraints in step 25. For steps 23,25, the sub-domain is solved with a timestep size equal to the period length, which may be different than the global timestep size. For example, the simulator may be taking a 2 day timestep, while the sub-domain is solved for a 30 day timestep. The sub-domain solve can be considered the same as creating a separate near-well model and then simulating this model with the appropriate boundary conditions. For example, for ten IPR points, ten sub-domain solves are carried out, which are equivalent to completing ten completely independent simulations on a small grid, but in the same process.

In step 27, the IPR on the network node coupled to the particular well is set. Steps 15,17,19,21,23,25,27 are repeated for all coupled wells in step 29. The IPR passed on to the surface facility network simulator typically includes a table with pressure (bottomhole or tubing head) and surface rates as columns. Each row in the table is a point on the IPRs at a particular pressure value. The range of the IPR may cover the entire operating range of the well, from the no-flow pressure to the pressure at the wells' maximum deliverable rate. However, it is often sufficient to sample the IPR over only a part of the entire pressure range. The surface facility network is then solved in step 31. The IPR becomes the boundary conditions for the surface facility network simulator. In step 33, the rate on the network node is queried and the well rate constraint is set. This is repeated in step 35 for all coupled wells. In step 37, the timestep is iterated to convergence. The timestep ends in step 39.

As one skilled in the art will appreciate, the results of method 10 can be used to make equipment improvements, such as to surface facilities, or for determining where to drill additional wells for increasing production. Injection and production flow rates can also be optimized, such as by altering various flow control devices (e.g., chokes or orifices). This can also impact relative rates at which oil, water and gas are produced from each wellbore. Any physical action associated with pattern balancing through injection and production rate allocation, locating and producing by-passed oil pockets, and tracking fluid displacements (in production, injection, or storage) can also be performed.

Figure 2:
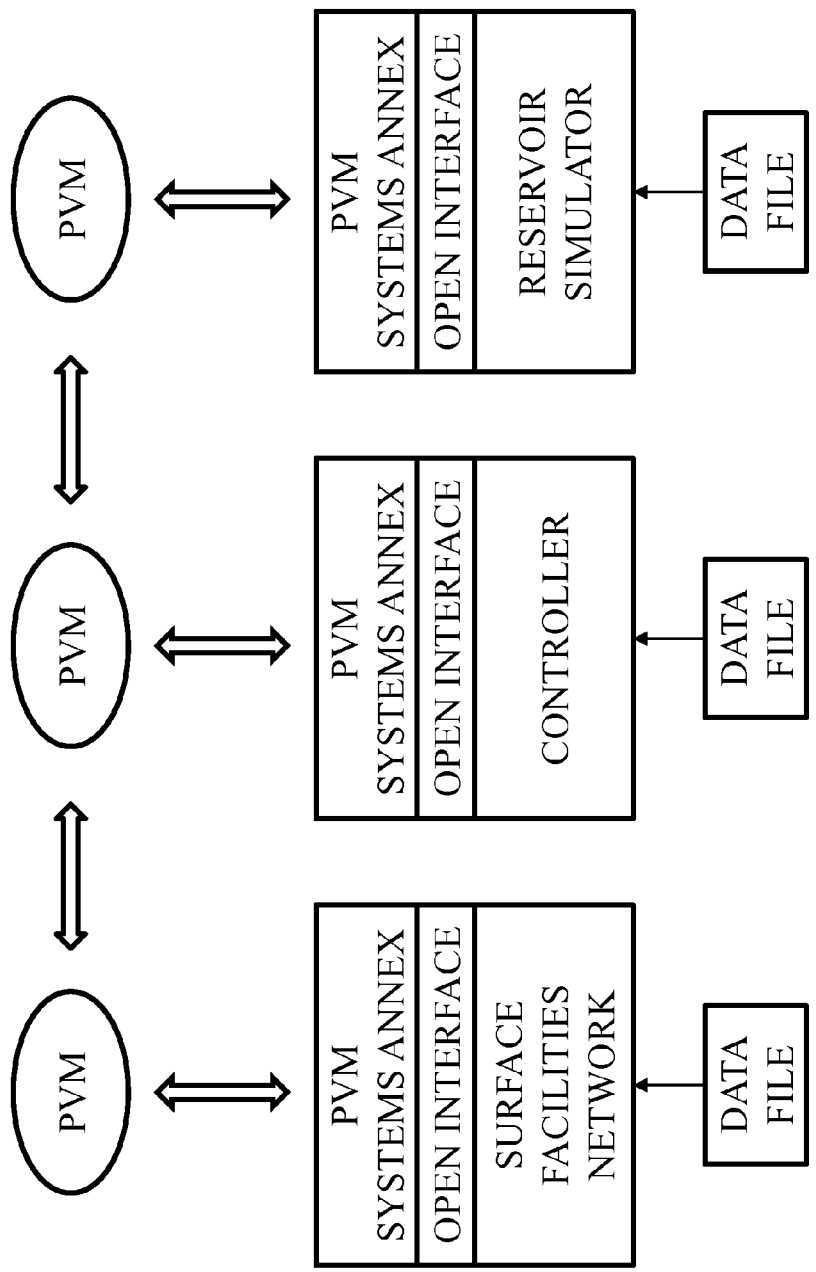
FIG. 2 illustrates a system for performing reservoir and surface facility network simulations.

FIG. 2 illustrates a system for performing reservoir and surface facility network simulations, which includes the reservoir simulator, the surface facility network simulator and a controller. Surface facility network simulations are performed by one or more independent surface facility network simulators. Reservoir simulations are performed by one or more independent reservoir simulators. The controller keeps the external surface facility network model balanced with the reservoir simulation as the reservoir conditions evolve, such as by method 10 shown in FIG. 1. The controller can also apply rate constraints, which it may either pass to the reservoir simulator to handle through its standard group control procedures or to the network model to be applied by adjusting the pressure drop.

In operation, system information can be input through the reservoir simulator the surface facility network simulator, or the controller. For example, a person is capable of interacting with the system such as through a keyboard, mouse, touch-screen display, or voice-command controls. Operator-entered data (e.g., user-defined parameters), or any information generated by system (e.g., system generated computed solutions), can be stored in one or more data files. The system can also include a visual display or reporting unit. For example, the output from simulations can be transformed into image data representations for display to a user or operator. Accordingly, "producing a visual display" or "display" or "displaying" includes any direct or indirect acts (electronically or physically) to report information or outputs of the system. The displayed information can be utilized to forecast or optimize the production performance of the subterranean reservoir, to enhance surface facilities, or used in making other reservoir management decisions.

The term "optimize" (as well as derivatives, other forms of this term, and linguistically related words and phrases), as used herein, are not intended to be limiting in the sense of requiring the present invention to find the best mathematical solution or to make the best decision. Rather, the terms can describe working towards a solution which may be the best available solution, a preferred solution, or a solution that offers a specific benefit within a range of constraints; or continually improving; or refining; or searching for a high point or a maximum for an objective; or processing to reduce a penalty function.

The controller utilizes a computer program product or software that couples the surface facility network simulations with the reservoir simulations. For example, the computer program product can be stored on a non-transitory computer usable or processor readable medium, which can be executed by one or more processors of the controller. Current examples of such non-transitory medium include, but are not limited to, read-only memory (ROM) devices, random access memory (RAM) devices and semiconductor-based memory devices. This includes flash memory devices, programmable ROM (PROM) devices, erasable programmable ROM (EPROM) devices, electrically erasable programmable ROM (EE-PROM) devices, dynamic RAM (DRAM) devices, static RAM (SRAM) devices, magnetic storage devices (e.g., floppy disks, hard disks), optical disks (e.g., compact disks (CD-ROMs)), and integrated circuits. Non-transitory medium can be transportable such that the one or more computer programs (i.e., a plurality of instructions) stored thereon can be loaded onto a computer resource (e.g., the controller) such that when executed, performs the aforementioned functions of the various embodiments of the present invention.

Communication between any components of system can be transferred over a communications network. Communications network can be any means that allows for information transfer to facilitate sharing of knowledge and resources, and can utilize any communications protocol such as the Transmission Control Protocol/Internet Protocol (TCP/IP). Examples of communications networks include, but are not limited to, personal area, networks (PANs), local area networks (LANs), wide area networks (WANs), campus area networks (CANs), and virtual private networks (VPNs). Communications network can also include any hardware technology or equipment used to connect individual devices in the network, such as by wired technologies (e.g., twisted pair cables, co-axial cables, optical cables) or wireless technologies (e.g., radio waves).

In one embodiment, the controller communicates with the surface facility network and reservoir simulator through an open interface, which enables the applications to exchange data via message packets. For example, the interface can construct the message packets and pass them to a parallel virtual machine (PVM) systems annex. The parallel virtual machine (PVM) is a software tool that allows for parallel networking. PVM handles the communications between the host computers where the different applications are run. One skilled in the art will appreciate that other communications protocol, such as a message passing interface (MPI), can alternatively be used.

The Open Interface

When the open interface is enabled, the simulator can be instructed to pause at "event loops" to wait for commands communicated through the interface. For example, an event loop can be defined at the start of each timestep, such as at step 11 of method 10. Another event loop could be at steps 23,25 where the sub-domain is solved for the particular period length. Another event loop can be at the end of each timestep at step 39, which would allow the final well rates to be interrogated before the next time step begins (or the run finishes).

In each event loop the controller can engage in a defined dialog with the reservoir simulator or in the network simulators, which have the same categories of dialog elements. For example, the elements of the dialog may include executive commands that instruct the simulator to perform a particular action. Examples of executive commands for the reservoir simulator include solving the production/injection system with the current constraints, performing the next Newton iteration of the time step, completing the solution of the time step, writing a report, or ending the run. Executive commands in the surface facility network simulators can include a command to solve the network with the current set of constraints and source/sink conditions. Another example of the dialog elements is set commands. Set commands can set well and group constraints, well stream compositions for injector wells, and reporting flags dictating what is written to the report files. Set commands can also set branch properties, rate or pressure constraints at nodes, and define the source/sink conditions. Query commands are another example of dialog elements. Query commands can inquire the flows in the branches and the pressure at the nodes. Query commands, such as in steps 19 and 33 of method 10, can inquire the time, date and timestep length, the time to the next report, the state of convergence of the timestep, and well or group quantities including flow rates, BHP/THP, and flow composition.

In some embodiments, the coupling points between the facility surface facility network and reservoir models are individual well tubing heads. In some embodiment, the coupling points are well-groups, wherein several wells connect sharing the same tubing head conditions. In some embodiments, the coupling points are the well bottom hole.

EXAMPLES

Figure 3:
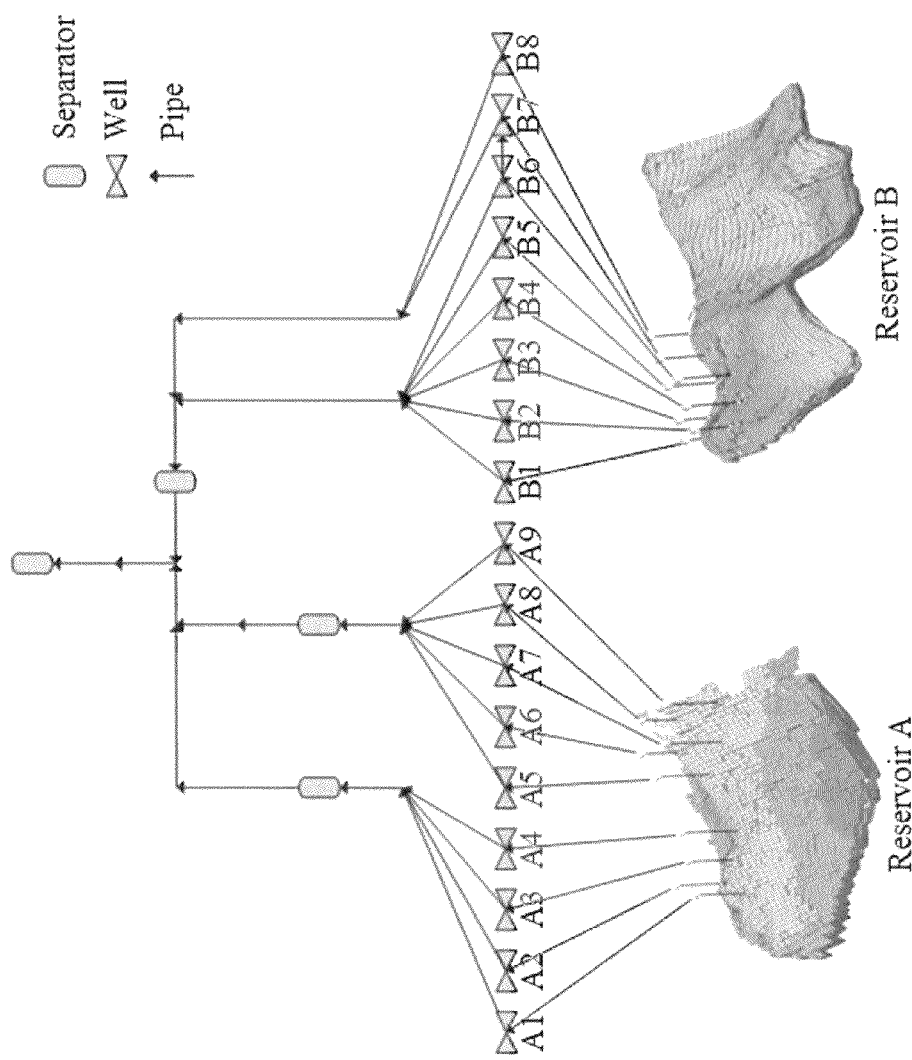
FIG. 3 illustrates the topology of two exemplary non-communicating gas reservoirs coupled to a single surface facility network.

FIG. 3 illustrates the topology of two exemplary non-communicating gas reservoirs (Reservoirs A and B) coupled to a single production surface facility network. Reservoir A has 9 producers and Reservoir B has 8 producers. The two reservoirs are modeled separately and run in two simulation processes. The surface facility network is modeled using an external tool. Reservoirs A and B have grids including 46,763 and 59,809 active cells, respectively.

The entire system is coupled with a controller that includes the coupling algorithms, the interfaces, and the adaptors for the reservoir and surface facility network simulators, as well as the framework for the processes to communicate over the TCP/IP network. The two reservoirs are run simultaneously and are allowed to timestep independently to reach the next balancing time. They may be run locally on the same or different machines (e.g., a cluster), and in serial or in parallel. The wells are coupled at the bottom hole and controlled by gas production rate constraints.

Figure 4:
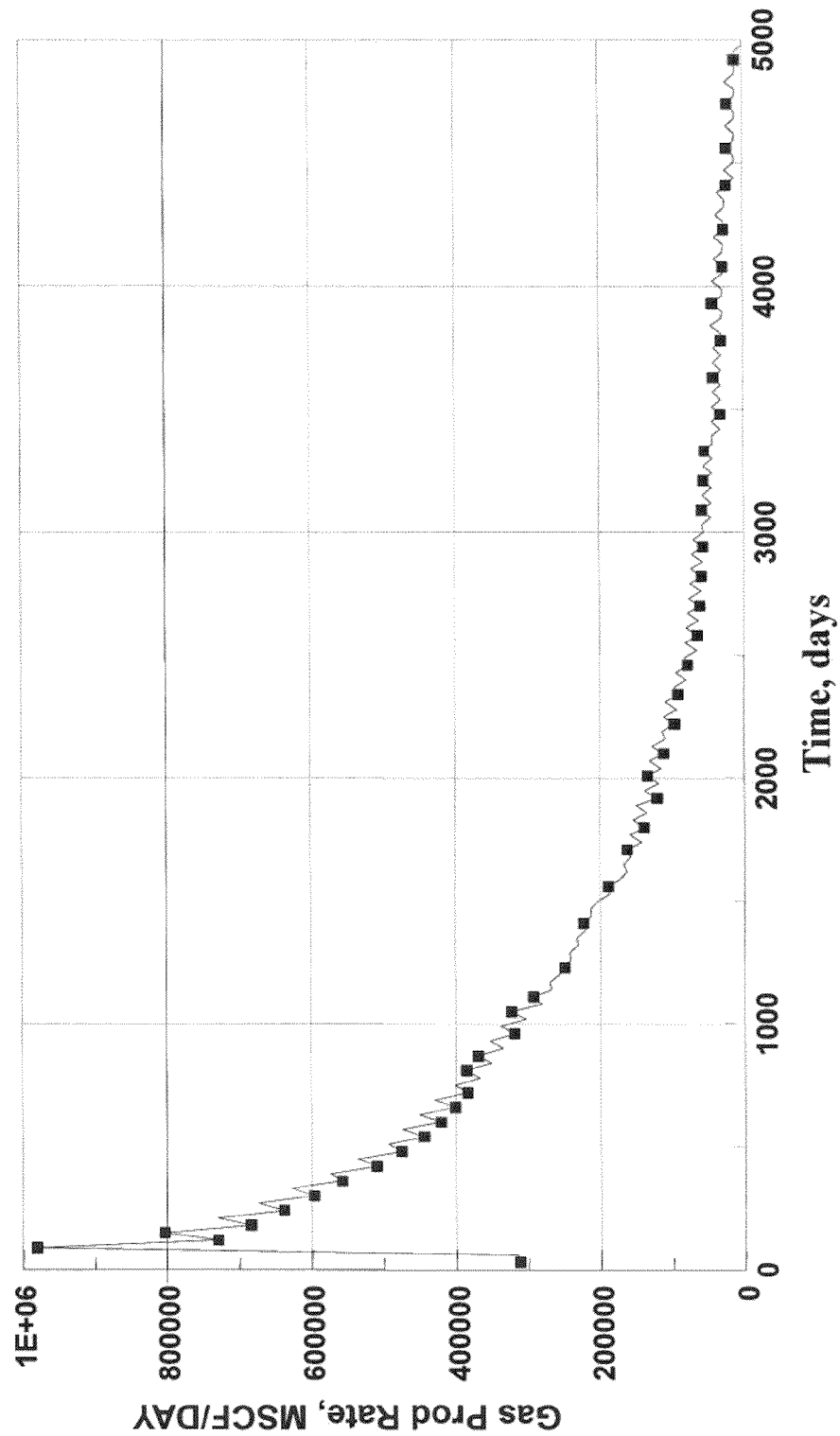
FIG. 4 shows the gas production rate profile for the non-communicating gas reservoirs shown in FIG. 3 generated using explicit Inflow Performance Relationships with a balancing period of 30 days.

FIG. 4 illustrates a base case gas production rate profile that is run for Reservoirs A and B using explicit IPRs with a balancing period of 30 days. As seen in FIG. 4, there are severe oscillations throughout the run. These are due to rapidly changing field conditions, which cannot be captured by utilizing explicit IPRs. The oscillations are at their worst earlier in the run with a maximum peak amplitude of around 125,000 thousand standard cubic feet per day (MSCF/D), which is significant and will likely hamper the decisions that may need to be made regarding facility design or field economics evaluations. The total run time for the explicit IPR run using a 30-day balancing period was 1 hour and 42 minutes.

Figure 5:
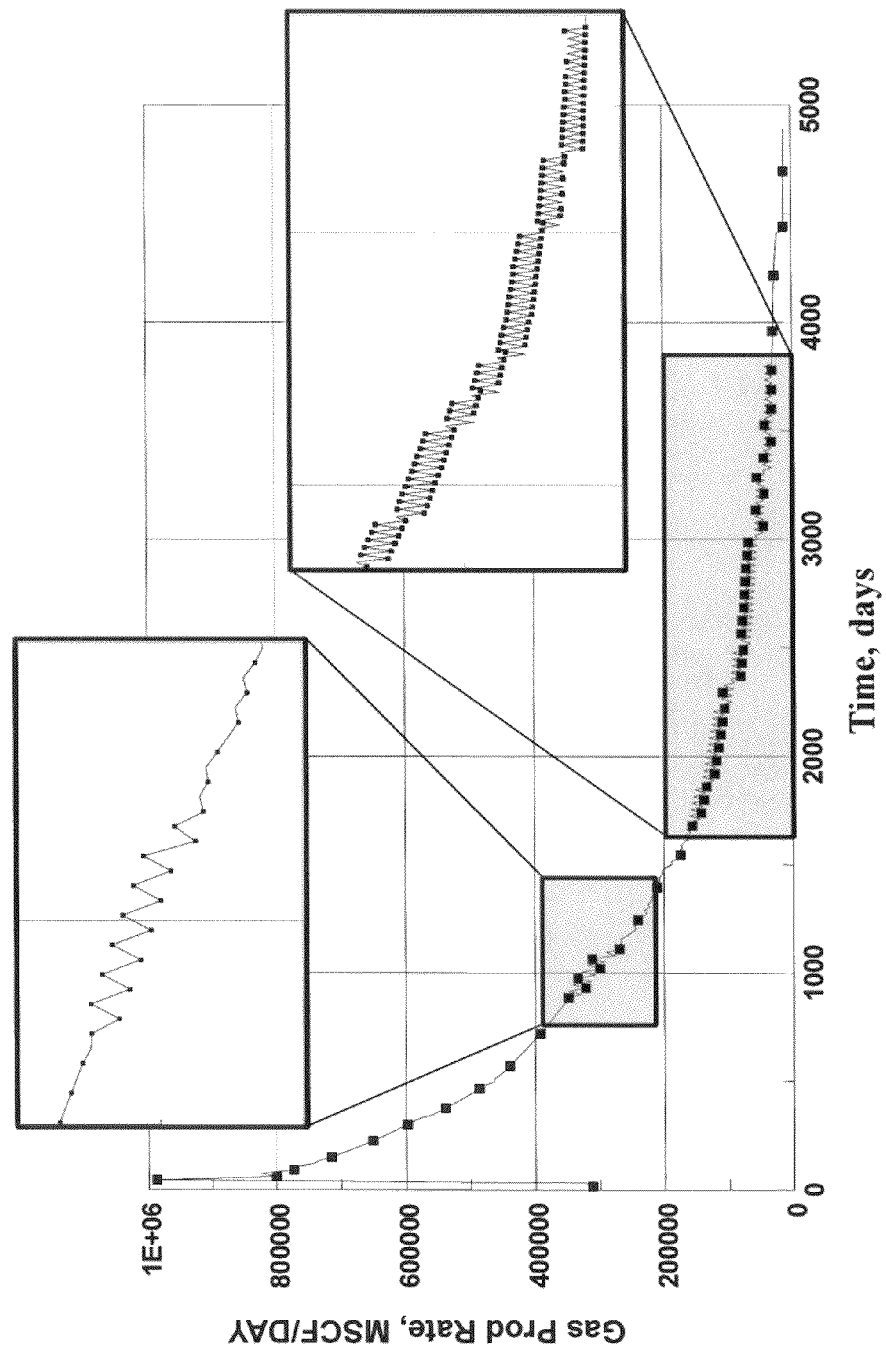
FIG. 5 shows the gas production rate profile for the non-communicating gas reservoirs shown in FIG. 3 generated using explicit Inflow Performance Relationships with a balancing period of 15 days.

FIG. 5 shows the resulting gas production rate profile for the total field (Reservoirs A and B) for a period length of 15 days. The balancing period length is one of the reasons why the explicit IPR results in oscillations. The oscillations have considerably lower amplitudes compared to explicit IPRs with a 30-day balancing period (FIG. 3), but they still exist. The total run time for the explicit IPR run with a 15-day balancing period was 2 hours and 30 minutes. This is considerably higher than the explicit IPR with a 30-day balancing period.

Figure 6:
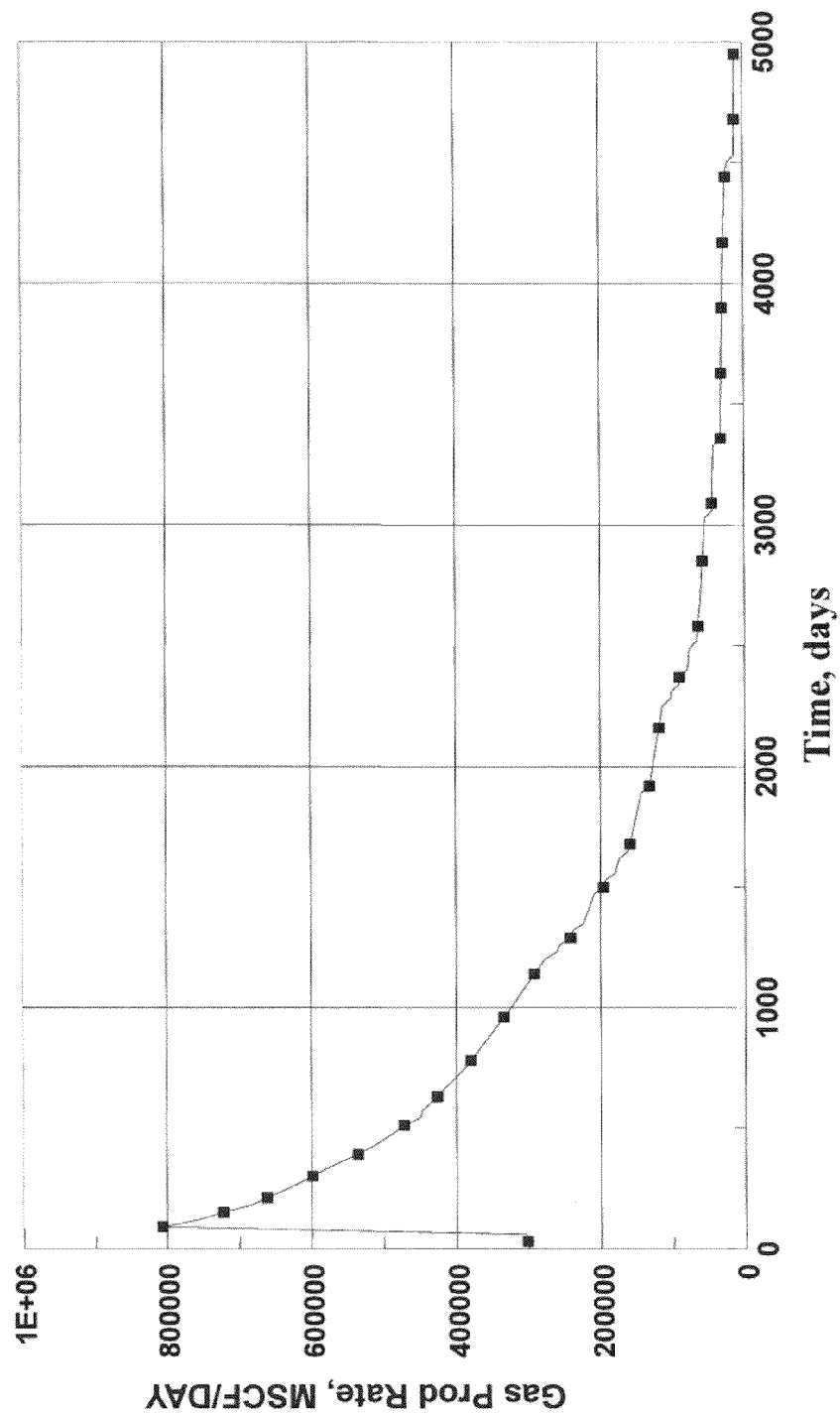
FIG. 6 shows the gas production rate profile for the non-communicating gas reservoirs shown in FIG. 3 generated using sub-domain Inflow Performance Relationships with a balancing period of 30 days and well neighborhood regions created with 5 cell-hops.

FIG. 6 shows the resulting gas production rate profile for Reservoirs A and B where sub-domain IPRs were applied with a 30-day balancing period. The regions used were obtained by hopping 5 cells away from the well connections. This resulted in regions around wells with an average of 767 cells. In this example, if can be seen that there are neglible oscillations and the profile is smooth and realistic. The total run time for the sub-domain IPR case with a 30-day balancing period and regions with 5 cell-hops was 1 hour and 53 minutes. The 11 minute increase in total run time compared to the explicit IPR case is justified by the elimination of oscillations and the reductions in balancing errors. The sub-domains were solved 2,398 times. The average time to solve a single sub-domain was 0.2499 seconds.

Figure 7:
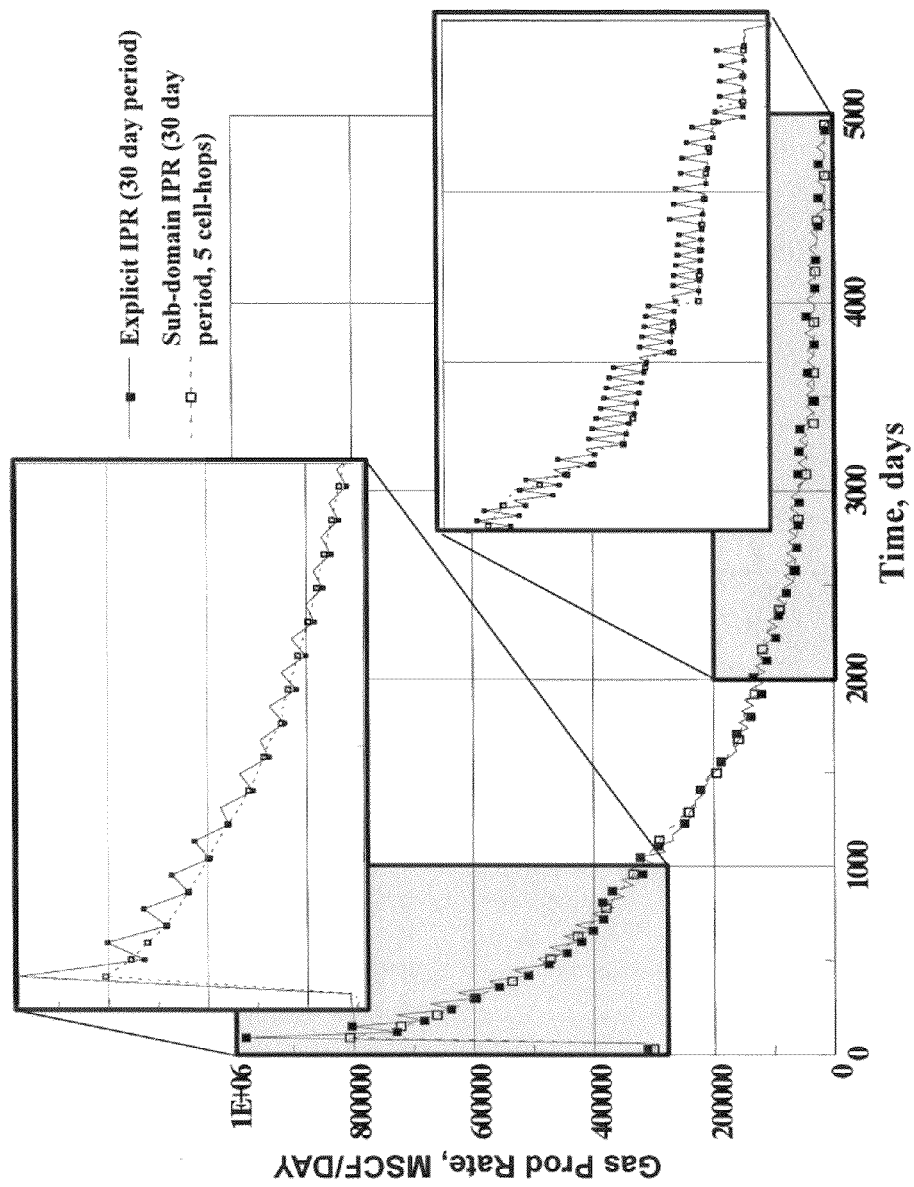
FIG. 7 shows a comparison of the gas production rate profiles shown in FIGS. 4 and 6.

FIG. 7 compares the profiles obtained by using explicit IPRs and sub-domain IPRs. The table below shows a summary of the runs.

| Case | Run time h:mm | Increase from base h:mm | % Increase from base | Oscillations | Balancing errors |
|---|---|---|---|---|---|
| Explicit IPR, 30-day period (base) | 1:42 | — | — | Severe | High |
| Explicit IPR, 15-day period | 2:30 | 0:48 | 47.1 | Moderate | Moderate |
| Subdomain IPR, 30-day period, 5 cell-hops | 1:53 | 0:11 | 10.8 | None | Moderate |
| Subdomain IPR, 30-day period, 10 cell-hops | 2:11 | 0:29 | 28.4 | None | Low |
| Subdomain IPR, 30-day period, flow-based | 2:28 | 0:46 | 45.1 | None | Mod~High |
| Explicit IPR region-based, 30-day period | 1:43 | 0:01 | 1.0 | None | Very High |

Figure 8:
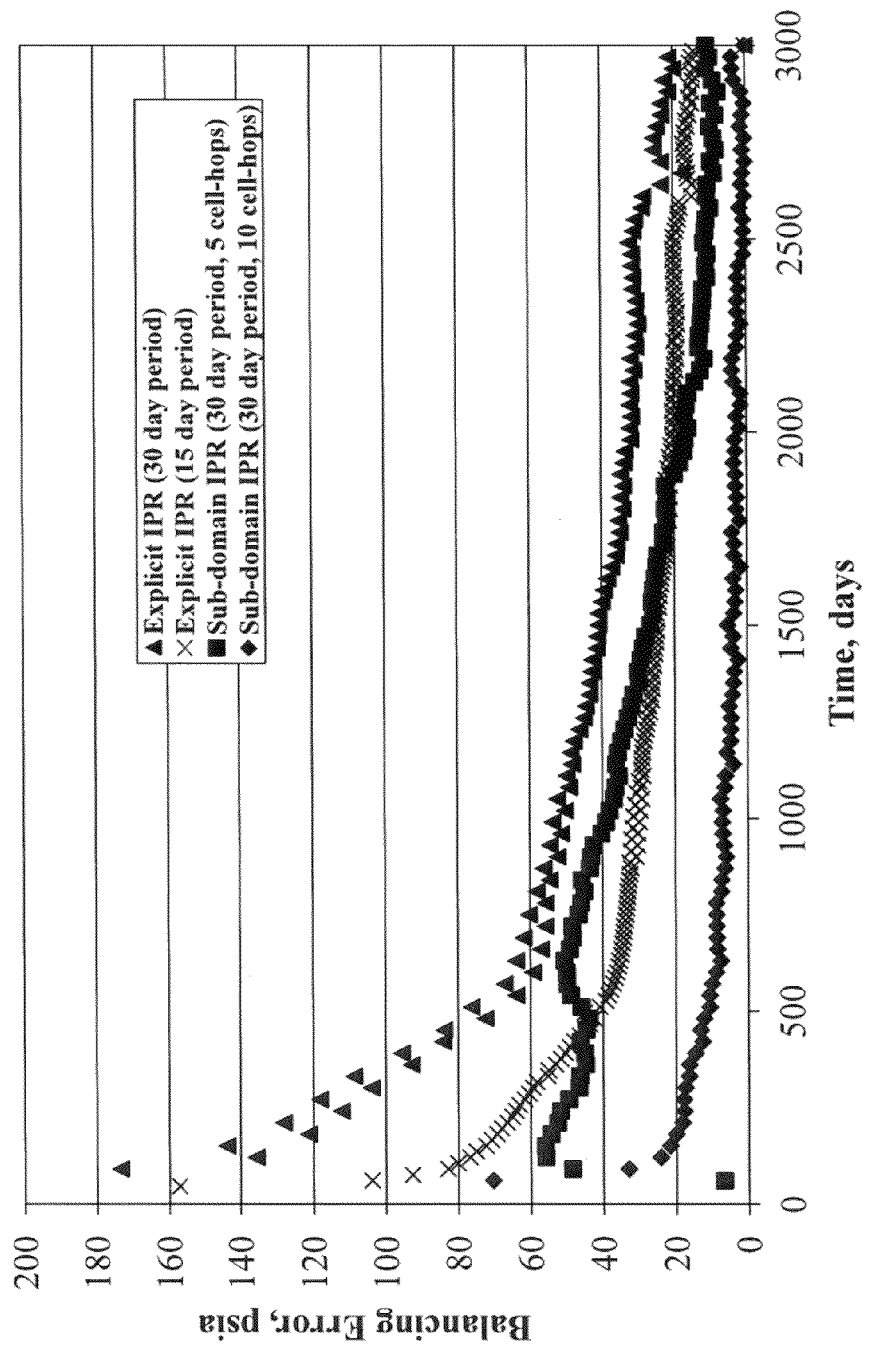
FIG. 8 compares pressure discrepancy balancing errors between the reservoir and the surface facility network models for a well at the end of every balancing period for coupled simulation methods using explicit and sub-domain Inflow Performance Relationships.

FIG. 8 shows the balancing errors for exemplary well A1, which represents the pressure discrepancies between the reservoir and the surface facility network model at the well. All the other wells in both of the reservoirs share similar balancing error profiles. What is plotted in FIG. 8 are the errors at the end ($t_i$) of the balancing period. As expected, explicit IPRs may suffer not just oscillations in rate profiles, but also high errors at the coupled wells. Reducing the balancing period length from 30 to 15 days reduces the balancing errors with explicit IPRs and makes them somewhat comparable to the sub-domain IPR with a 30-day balancing period and regions with 5 cell-hops. However, even with a reduced 15-day balancing period for explicit IPRs, oscillations persist and the run time is increased considerably. Furthermore, by increasing the sub-domain extent to include cells within 10 cell-hops, balancing errors are reduced even greater. This produces a similar production profile to that in FIG. 6. The total run time for the sub-domain IPR case with 30 day period and regions with 10 cell-hops was 2 hours 11 minutes.

Balancing errors indicate a decrease in the accuracy of the rate and pressure profiles obtained from the coupled run. The higher the balancing errors, the more the rate profiles diverge from the correct base case solution. For the purpose of comparing accuracy among the different methods used, we consider the sub-domain IPR with 10 cell-hops to be the base case solution to compare against, since it results in the lowest balancing errors (FIG. 8). The table below shows the cumulative rates obtained with different methods. It can be seen that explicit methods show significant divergence.

| Case | Cumulative gas production, MSCF | Discrepancy MSCF | % Difference from base |
| --- | --- | --- | --- |
| Explicit IPR, 30-day period | 840,554,000 | 20,350,000 | −2.5 |
| Explicit IPR, 15-day period | 833,211,000 | 13,007,000 | −1.6 |
| Subdomain IPR, 30-day period, 5 cell-hops | 818,510,000 | −1,694,000 | 0.2 |
| Subdomain IPR, 30-day period, 10 cell-hops | 820,204,000 | — | — |
| Subdomain IPR, 30-day period, flow-based | 793,025,000 | −27,179,000 | −3.3 |
| Explicit IPR region-based, 30-day period | 865,199,000 | 44,995,000 | −5.5 |

Flow-Based Regions

Flow-based regions were utilized such that the region around a well was made up of cells that are flowing towards that well. At the beginning of the run, the regions around the wells included only the well-connected cells. As the run progressed through time, the region size changed according to the flow patterns in the reservoir. With flow-based regions, in the extreme case with a reservoir with a single well, after the drainage pattern is established (e.g., pseudosteady state), all the cells in the grid would be included in the well's region. In the more general case where there are multiple wells, after the first several balancing periods, during which the regions are still small due to small drainage areas, the wells that have a flow path to the grid boundaries unobstructed by other well's drainage areas often end up with unnecessarily large regions. This may be unsatisfactory since only cells that are in the vicinity of the well are needed. This will likely be reflected in the run times. On the other hand, flow-based regions are generally too small for wells that are surrounded by other wells, or when the well is shut in for a period and then comes back online. This will likely be reflected in the balancing errors.

Figure 9:
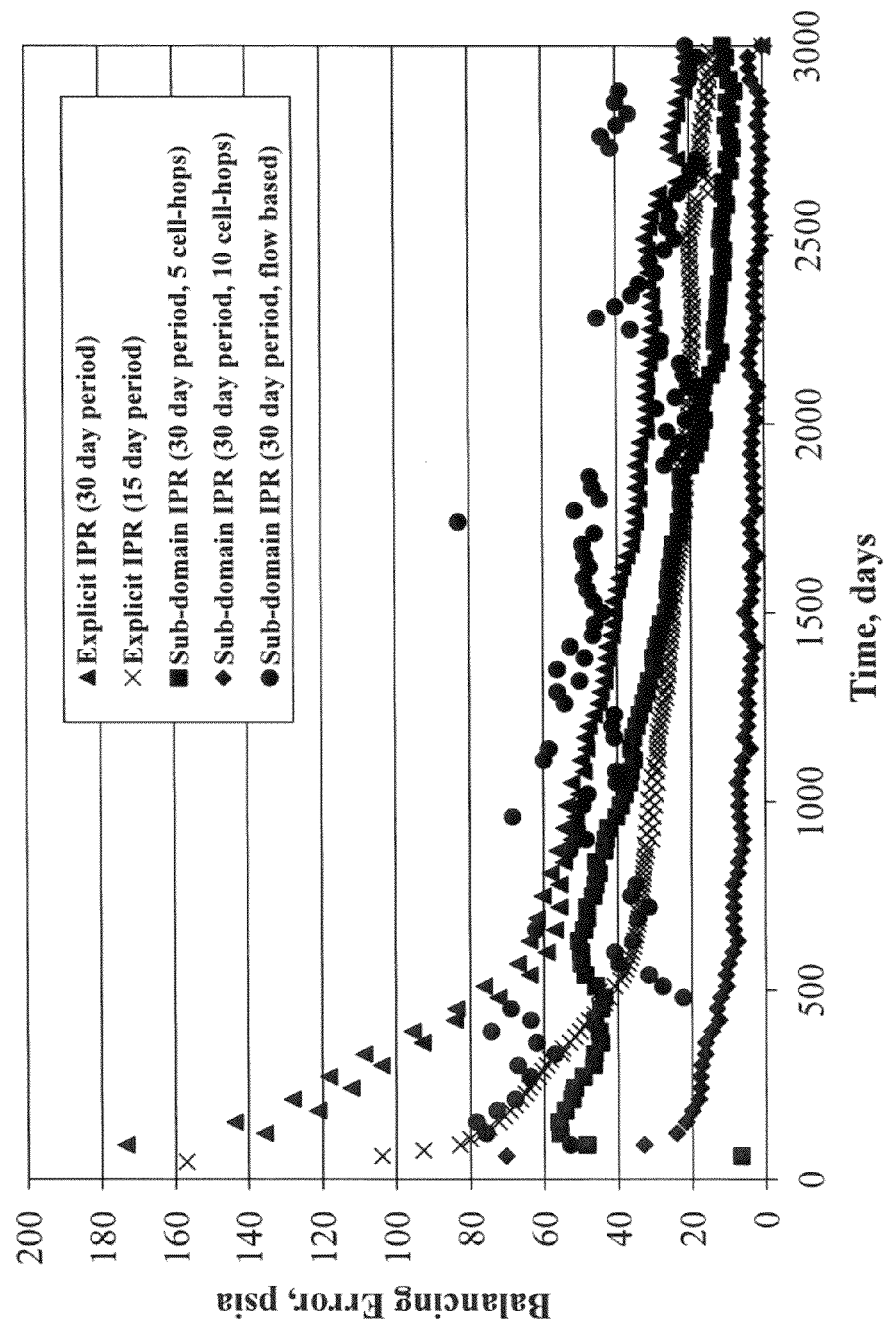
FIG. 9 compares pressure discrepancy balancing errors for a coupled simulation method using flow-based sub-domain Inflow Performance Relationships with the pressure discrepancy balancing errors shown in FIG. 8.

FIG. 9 shows the balancing errors for well A1, obtained using sub-domain IPRs with flow-based regions for Reservoirs A and B with a balancing period of 30 days. The total run time with the flow-based regions was 2 hours and 28 minutes. The balancing errors vary from moderate to high and do not share the smooth profiles obtained with the other methods. This is because the extent of the flow-based regions changes as the simulation progresses and these-changes are not always gradual. Accordingly, relatively high errors combined with long run times can make flow-based regions inappropriate for the purpose of reservoir-network coupling.

Distance-Based Regions

Figure 10:
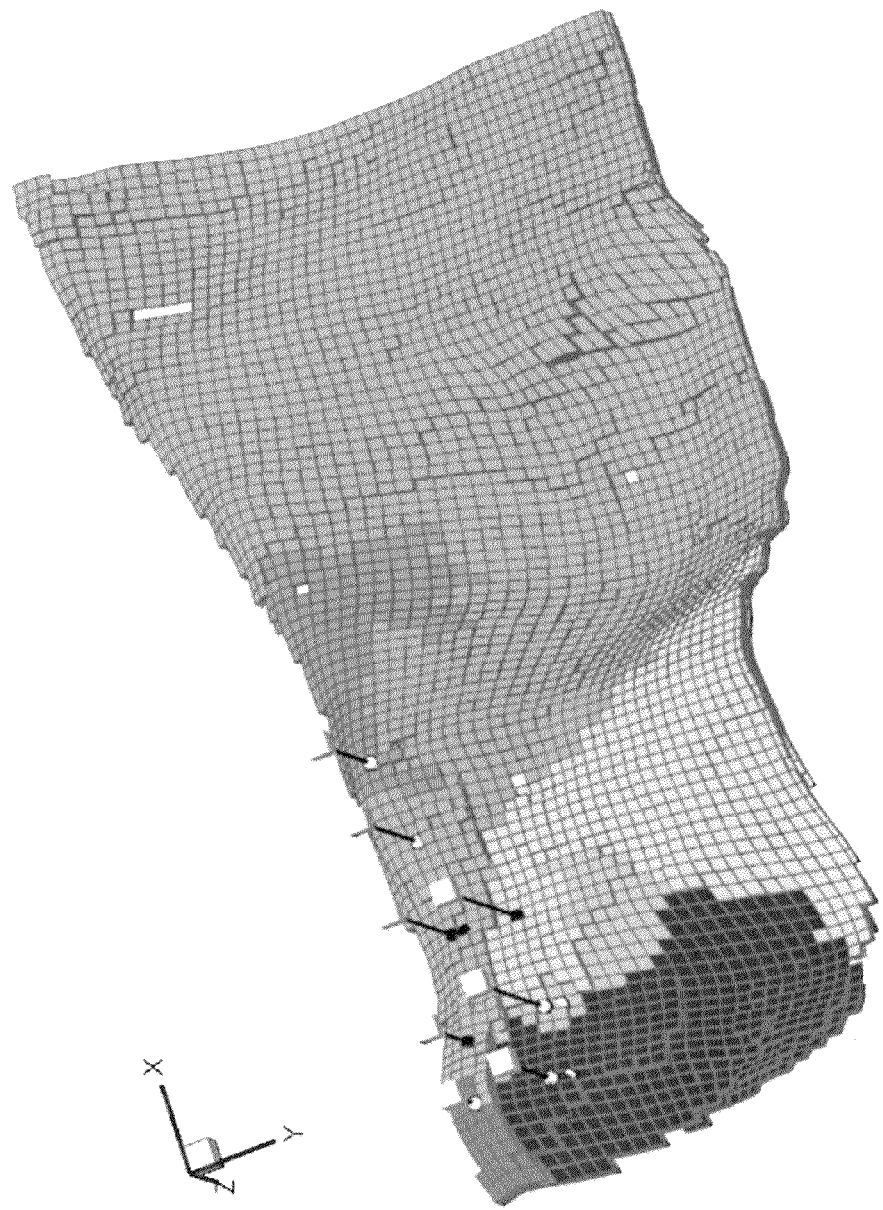
FIG. 10 illustrates distance-based partitioning of the grid for one of the exemplary non-communicating gas reservoirs shown in FIG. 3.

FIG. 10 shows the distance-based partitioning for Reservoir B. All the cells in the grids are assigned to one, and only one, well. While distance-based partitioning produces results that are in line with sub-domain IPRs with 10 cell-hops, the total run time was unacceptably high at 36 hours and 59 minutes. This is primarily due to the small number of wells on large grids, which resulted in much larger than necessary sub-domain regions. In addition, the clustering of wells in the reservoirs resulted in several of the outer wells having sub-domains that were much larger than the interior wells within the cluster (FIG. 10). Accordingly, distance-based partitioning is inappropriate for Reservoir B; however, may be more suitable when wells are placed evenly and densely around the grid, for instance for onshore fields that have more dense and even well patterns.

Explicit Region-Based IPR

The sub-domain IPR results were compared to an alternative method of addressing oscillations that use the average pressure of a region around the well as the no-flow pressure point to create a linear IPR curve. As used herein, this method will be referred to as the explicit region-based IPR. In this method, the average pressure of a region around the well is corrected to the well's bottomhole reference depth by adding/subtracting a hydrostatic head to each cell within the region that utilizes a saturation weighted average density. This average region pressure is then used as the no-flow point in a two-point IPR (i.e., linear) since the region-based no-flow pressure is thought to be more representative for the next period than the well's current no-flow pressure. The linear IPR consists of two points, the no-flow point (the region average pressure) and the well's current operating point.

Figure 11:
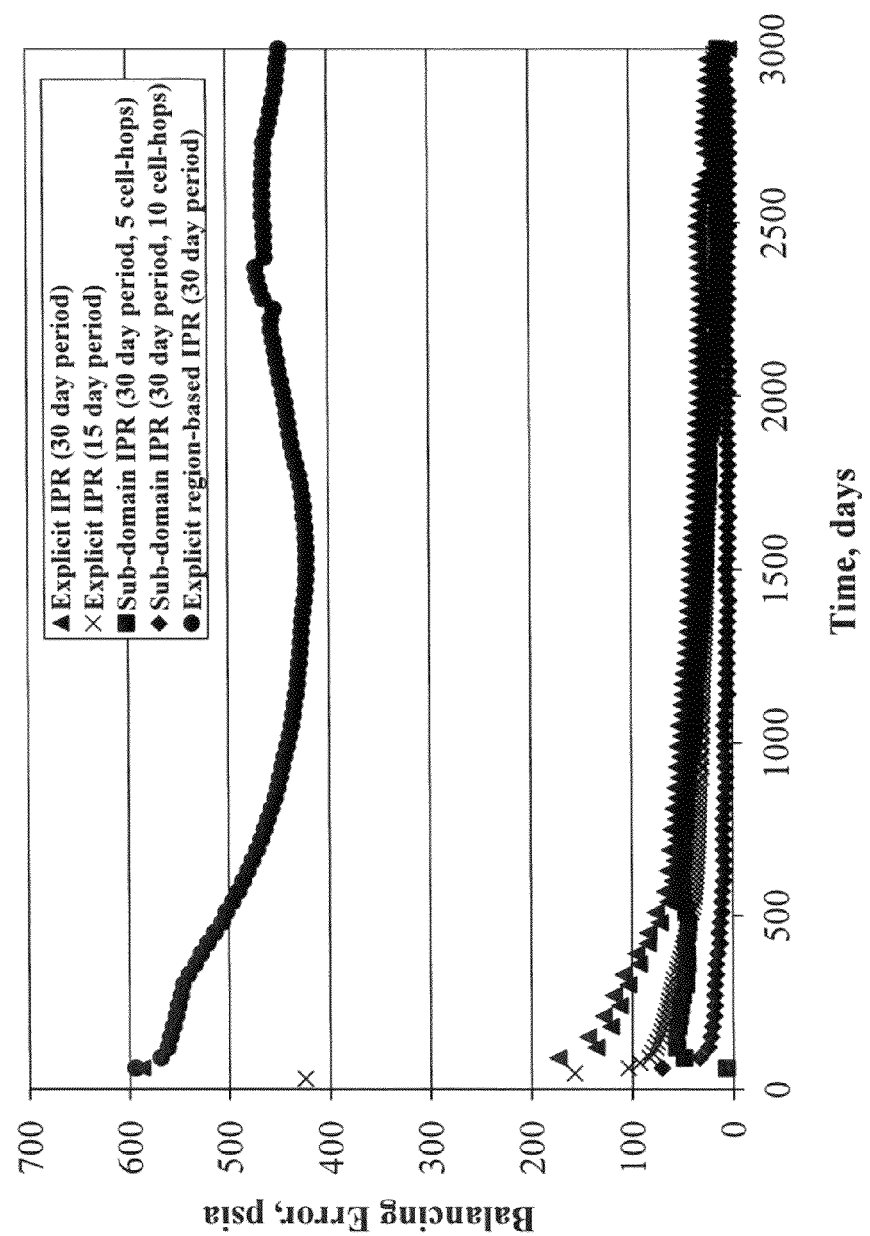
FIG. 11 compares pressure discrepancy balancing errors for a coupled simulation method using explicit region-based Inflow Performance Relationships with the pressure discrepancy balancing errors shown in FIG. 8.

FIG. 11 shows the balancing errors for well A1, obtained using explicit region-based IPRs for Reservoirs A and B with a balancing period of 30 days. The run made with the explicit region-based IPR utilizing regions that are 5 cell-hops away from the wells eliminates the oscillations and took 1 hour and 43 minutes to complete. However, the balancing errors are very high—much higher than those observed with other methods, including explicit IPRs. This is primarily because of the incorrect IPR slope, since the operating point is based on current conditions at the reservoir grid cells containing the well completions, while the no-flow point comes from the average conditions within the region. Due to the high balancing errors, the well rate and field cumulative production profiles are also significantly different. Table 2 shows that explicit region-based IPR results in 44,995,000 MSCF higher gas cumulative production than the sub-domain IPR with 10 cell-hops, which is considered the base case since it provides the most accurate rate profile (i.e., the lowest balancing errors).

The examples demonstrate that for comparable run times the use of sub-domain IPRs can produce smooth production profiles with significantly reduced balancing errors compared to explicit IPRs. Moreover, explicit IPRs would require a considerably smaller balancing period to achieve similar degrees of smoothness and accuracy that were obtained with the sub-domain IPRs over the 30-day balancing period. A reduction in the balancing period from 30 days to 15 days has some effect in reducing the oscillations and balancing errors produced by explicit IPRs. However, this also results in a significant increase in total run time for the explicit IPRs. Furthermore, coupling with explicit IPRs becomes less stable as the size of the grid cells containing the well connections is reduced. Thus, the use of sub-domain IPRs is expected to bring greater benefits in cases where it is necessary to construct a fine grid around the well for detailed modeling of near-wellbore effects.

The multiple reservoir simulations advance through time simultaneously. In addition, each reservoir simulation can be run in parallel mode. However, when the balancing algorithm is being executed, the sub-domain IPRs are calculated sequentially, hence this is an obvious candidate for further parallel processing. The construction of the sub-domain IPRs for each well can be performed independently of the other wells, and thus could be done in parallel.

The sub-domain extents in the examples were, somewhat arbitrarily, set to a given number of cell-hops from the well. For convenience of implementation, these were made independent of grid cell size. However, the sub-domains could be constructed to include the cells within a given distance-measure from the well. For example, in some embodiments the sub-domain can extend out to the radius of investigation that is used in well test analysis, for a typical balancing interval. The radius of investigation refers to the radius within which the pressure response is affected by a point source well producing for a certain period of time. The radius of investigation ($r_{inv}$) in field units is given by:

$$r_{inv} = 0.03\sqrt{\frac{kt}{\phi\mu c_t}} \quad \text{(Equation 1)}$$

where k is permeability, t is time, $\phi$ is porosity, $\mu$ is viscosity, and $c_t$ is total compressibility. However, for long balancing intervals this may cover a substantial part of the reservoir and would likely be unsuitable for a sub-domain. For instance for Reservoir A, with average values, the radius of investigation for a well makes up a region that is around 17.2% of the volume of the entire grid. Note that the radius of investigation as defined in Equation 1 is not dependent on the well rate, but for the purpose of defining a region for sub-domain IPR calculations, intuitively, the distance measure to use should depend on the well rate.

Another sub-domain construction method that has been applied is the flow-based sub-domain. The simulator examines the flow in each cell, working outwards from the well, and stops when the dominant flow direction is no longer towards the well. Essentially, it can partition the reservoir grid into the drainage regions for each well. However, extending the sub-domain out to the edge of a well's drainage region might be inefficient, especially for small balancing intervals. This is due to the disadvantage of this approach in that the region extents do not directly depend on the period length.

Another approach to determine the appropriate region extent is based on a time of flight analysis. The time of flight along a streamline is given by:

$$\tau = \int_0^s \frac{\phi}{|\vec{u}_t(\sigma)|} d\sigma \quad \text{(Equation 2)}$$

where $\tau$ is the time required to reach point s on the streamline based on the total velocity $\vec{u}_t(\sigma)$ along this streamline. Given a balancing period length, all the cells with a time of flight less than this period length would be included in the well's domain.

Instead of basing the region extent on directly observable reservoir quantities, another approach is to implement ah adaptive method that dynamically adjusts the sub-domain size based on the balancing errors observed in the previous period. Similarly the region extent may be kept constant but the period length may be adjusted based on the balancing errors.

The sub-domain IPR method also should allow for larger balancing period lengths without the disadvantage of a significant increase in balancing errors. This will be beneficial especially when the surface facility network model is computationally demanding since large balancing periods will result in fewer surface facility network solves.

Simulating local sub-domains around wells to generate IPRs representative of the end of the balancing period improves reservoir and surface facility network coupling. Balancing between the reservoir and surface facility network models using these forward-looking IPRs substantially reduces balancing errors and oscillations. This advantage over conventional explicit coupling schemes does not require any derivatives from either model. The example results showed that decreasing the balancing period length helped bring the balancing errors with explicit IPRs to levels comparable with sub-domain IPRs, but these cases still produced oscillations and their run times increased significantly. Also, the extent of the regions around the wells was a key factor for sub-domain IPRs. A reasonable increase in the region extent helped decrease balancing errors; however, needlessly large regions resulted in unpractically high run times without a significant increase in accuracy.

Accordingly, the above described method, system and apparatus disclose calculation of multipoint, nonlinear Inflow Performance Relationships (IPRs) by solving near-well sub-domains for the subsequent timestep. A flexible reservoir simulation architecture enables the dynamic creation and simulation of near-well sub-domains at run time. Sub-domains are automatically created within the vicinity of the well, or defined dynamically from the pressure gradient. These near-well sub-domain simulations are embedded within the full-field simulation, and extract all the required model properties from the full-field model. The most recent fluxes from the global solution are used as boundary conditions for the near-well sub-domains. The IPRs created through sub-domain solutions agree with those generated by carrying out the full-field simulation multiple times.

As used in this specification and the following claims, the terms "comprise" (as well as forms, derivatives, or variations thereof, such as "comprising" and "comprises"), "have" (as well as forms, derivatives, or variations thereof, such as "having" and "has"), "include" (as well as forms, derivatives, or variations thereof, such as "including" and "includes"), or "contain" (as well as forms, derivatives, or variations thereof, such as "containing" and "contains") are inclusive (i.e., open-ended) and do not exclude additional elements or steps. Accordingly, these terms are intended to not only cover the recited element(s) or step(s), but may also include other elements or steps not expressly recited.

Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

While the invention has been shown in only some of its forms, it should be apparent to those skilled in the art that it is

NOMENCLATURE $c_t$=total compressibility, 1/psi
$d_{ij}$=measure of distance between cells i and j
k=permeability, md
s=distance along streamline, L
t=time, t
$T_c$=transmissibility, $(cP.m^3)/(d.bar)$
$\vec{u}_t$=total velocity, L/t
σ=local streamline coordinate, L
μ=viscosity, cP
τ=time of flight, t
φ=porosity

What is claimed is:

1. A method for coupling independent reservoir and surface facility network simulators, the method comprising:
   (a) providing a reservoir simulator configured to simulate fluid flow in subterranean reservoirs and a surface facility network simulator configured to simulate fluid flow in production equipment;
   (b) initiating simulation of fluid flow in a subterranean reservoir using the reservoir simulator;
   (c) initiating simulation of fluid flow in production equipment using the surface facility network simulator, the fluid flow in the production equipment including fluids produced from the subterranean reservoir; and coupling the simulation of fluid flow in the subterranean reservoir with the simulation of fluid flow in the production equipment using a sub-domain inflow performance relationship,
      wherein the sub-domain inflow performance relationship defines reservoir sub-domains for the reservoir simulator by selecting reservoir grid cells for one or more wells and the reservoir sub-domains are defined once per simulation run.

2. The method of claim 1, wherein the sub-domain inflow performance relationship allows for changes in reservoir grid cell conditions over timesteps.

3. The method of claim 1, wherein:
   the sub-domain inflow performance relationship defines a plurality of sub-domains each comprising a region around a well; and
   fluxes from the global solution are used as boundary conditions for the plurality of sub-domains.

4. The method of claim 1, wherein coupling the simulation of fluid flow in the subterranean reservoir with the simulation of fluid flow in the production equipment using the sub-domain inflow performance relationship comprises:
   (i) selecting a plurality of reservoir grid cells associated with one or more wells to create reservoir sub-domains;
   (ii) simulating the reservoir sub-domains to create the sub-domain inflow performance relationship; and
   (iii) utilizing the sub-domain inflow performance relationship as a boundary condition for simulating fluid flow in the production equipment using the surface facility network simulator.

5. The method of claim 1, wherein:
   the sub-domain inflow performance relationship defines reservoir sub-domains for the reservoir simulator by selecting reservoir grid cells for one or more wells; and
   the reservoir grid cells are simulated within each sub-domain region from a $t_{i-1}$ to $t_i$ reservoir state.

6. The method of claim 1, wherein:
   the sub-domain inflow performance relationship defines reservoir sub-domains for the reservoir simulator by selecting reservoir grid cells for one or more wells; and
   the reservoir grid cells are updated in the reservoir sub-domains for the one or more wells at each balancing period in a simulation run.

7. The method of claim 1, wherein the sub-domain inflow performance relationship defines reservoir sub-domains for the reservoir simulator, defines nodes and connecting edges for the reservoir sub-domains, and creates a property map including static and dynamic reservoir properties.

8. The method of claim 1, wherein the sub-domain inflow performance relationship defines flow-based regions.

9. The method of claim 1, wherein the sub-domain inflow performance relationship defines distance-based regions.

10. The method of claim 1, wherein the sub-domain inflow performance relationship defines cell neighborhood regions.

11. The method of claim 10, wherein the cell neighborhood regions are constructed to include grid cells within a given distance-measure from a well.

12. A method for coupling independent reservoir and surface facility network simulators, the method comprising:
   (a) providing a reservoir simulator configured to simulate fluid flow in subterranean reservoirs and a surface facility network simulator configured to simulate fluid flow in production equipment;
   (b) initiating simulation of fluid flow in a subterranean reservoir using the reservoir simulator;
   (c) initiating simulation of fluid flow in production equipment using the surface facility network simulator, the fluid flow in the production equipment including fluids produced from the subterranean reservoir; and
   (d) coupling the simulation of fluid flow in the subterranean reservoir with the simulation of fluid flow in the production equipment using a sub-domain inflow performance relationship,
      wherein the sub-domain inflow performance relationship defines reservoir sub-domains for the reservoir simulator, defines nodes and connecting edges for the reservoir sub-domains, and creates a property map including static and dynamic reservoir properties.

13. The method of claim 12, wherein the sub-domain inflow performance relationship allows for changes in reservoir grid cell conditions over timesteps.

14. The method of claim 12, wherein:
   the sub-domain inflow performance relationship defines a plurality of sub-domains each comprising a region around a well; and
   fluxes from the global solution are used as boundary conditions for the plurality of sub-domains.

15. The method of claim 12, wherein coupling the simulation of fluid flow in the subterranean reservoir with the simulation of fluid flow in the production equipment using the sub-domain inflow performance relationship comprises:
   (i) selecting a plurality of reservoir grid cells associated with one or more wells to create reservoir sub-domains;
   (ii) simulating the reservoir sub-domains to create the sub-domain inflow performance relationship; and
   (iii) utilizing the sub-domain inflow performance relationship as a boundary condition for simulating fluid flow in the production equipment using the surface facility network simulator.

16. The method of claim 12, wherein:
the sub-domain inflow performance relationship defines reservoir sub-domains for the reservoir simulator by selecting reservoir grid cells for one or more wells; and
the reservoir grid cells are simulated within each sub-domain region from a $t_{i-1}$ to $t_i$ reservoir state.

17. The method of claim 12, wherein:
the sub-domain inflow performance relationship defines reservoir sub-domains for the reservoir simulator by selecting reservoir grid cells for one or more wells; and
the reservoir sub-domains are defined once per simulation run.

18. The method of claim 12, wherein:
the sub-domain inflow performance relationship defines reservoir sub-domains for the reservoir simulator by selecting reservoir grid cells for one or more wells; and
the reservoir grid cells are updated in the reservoir sub-domains for the one or more wells at each balancing period in a simulation run.

19. The method of claim 12, wherein the sub-domain inflow performance relationship defines flow-based regions.

20. The method of claim 12, wherein the sub-domain inflow performance relationship defines distance-based regions.

21. The method of claim 12, wherein the sub-domain inflow performance relationship defines cell neighborhood regions.

22. The method of claim 21, wherein the cell neighborhood regions are constructed to include grid cells within a given distance-measure from a well.

* * * * *